United States Patent [19]

Ito

[11] Patent Number: 5,422,310
[45] Date of Patent: Jun. 6, 1995

[54] METHOD OF FORMING INTERCONNECTION IN SEMICONDUCTOR DEVICE

[75] Inventor: Masahiko Ito, Kanagawa, Japan

[73] Assignee: Sony Corporation, Tokyo, Japan

[21] Appl. No.: 193,533

[22] Filed: Feb. 8, 1994

[30] Foreign Application Priority Data

Feb. 9, 1993 [JP] Japan .................................. 5-021434

[51] Int. Cl.⁶ ...................... H01L 21/302; H01L 21/38
[52] U.S. Cl. ...................................... 437/192; 437/228; 437/245; 216/13; 216/518
[58] Field of Search ................. 156/656, 643; 437/192, 437/228, 245, 196; 257/751, 763, 764

[56] References Cited

U.S. PATENT DOCUMENTS

| | | | |
|---|---|---|---|
| 4,657,628 | 4/1987 | Holloway et al. | 156/656 |
| 4,793,896 | 12/1988 | Douglas | 156/656 |
| 4,884,123 | 11/1989 | Dixit et al. | 437/192 |
| 5,227,337 | 7/1993 | Kadomura | 156/656 |
| 5,254,498 | 10/1983 | Sumi | 437/192 |

*Primary Examiner*—George Fourson
*Assistant Examiner*—Thomas G. Bilodeau
*Attorney, Agent, or Firm*—Hill, Steadman & Simpson

[57] ABSTRACT

To form an interconnection on a substrate, an interconnection material layer is deposited on a surface of a substrate having a step with a base layer of Ti-base metal disposed between the interconnection material layer and the substrate, and the interconnection material layer is etched by way of dry etching using a fluorine gas until a surface of the base layer is exposed. After the surface of the base layer is exposed, the substrate is heated to a temperature ranging from 250° C. to 600° C., and the interconnection material layer and the base layer are continuously etched by way of dry etching. The process allows an interconnection pattern to be reliably formed on the stepped substrate surface.

4 Claims, 4 Drawing Sheets

METHOD OF FORMING INTERCONNECTION IN SEMICONDUCTOR DEVICE

BACKGROUND OF THE INVENTION

1. Field of the Invention

The present invention relates to a method of and an apparatus for forming an interconnection or conductive path in an electronic device such as a semiconductor device, for example.

2. Description of the Related Art

To meet requirements for smaller sizes and higher packing densities, electronic devices including integrated semiconductor circuits such as a VLSI circuit, a ULSI circuit, or the like incorporate a multilayer interconnection structure including interconnections and electrodes (hereinafter collectively referred to as "interconnections") with inter-insulating layers disposed therebetween. Efforts are being made to increase the density of and reduce the pattern of interconnections in electronic devices to meet demands for electronic devices of much smaller sizes and higher packing densities.

Interconnections on an upper surface of inter-insulating layer are connected, by way of ohmic contact, through connecting holes such as contact holes or via holes defined in the inter-insulating layer to other interconnections or semiconductor regions (hereinafter referred to as "contact regions") such as impurity-diffused regions of Si semiconductors beneath the inter-insulating layer. The connecting holes are also required to be smaller in diameter.

It is necessary that the inter-insulating layers have a certain thickness in order to provide a desired level of electric reliability and avoid the problem of parasitic capacitance. Consequently, the aspect ratio (depth-/diameter) of the connecting holes is relatively large.

Metal plugs may be embedded in connecting holes of large aspect ratios for connection to an upper interconnection layer. To form such metal plugs, blanket tungsten (Blk-W) is deposited by way of chemical vapor deposition (CVD).

To hold a layer of blanket tungsten in intimate contact with a lower layer, a barrier metal layer of Ti is employed as a base layer beneath the upper interconnection layer (see, for example, Shingaku Gihou SMD91-133, pages 19~24).

One conventional process of forming such an interconnection structure is illustrated in FIGS. 1A, 1B, and 1C of the accompanying drawings.

In FIGS. 1A, 1B, and 1C, an interconnection will be connected to a semiconductor region 2 of a substrate 1 such as a semiconductor substrate through a connecting hole 4 defined in an inter-insulating layer 3 deposited on the substrate 1, as follows: First, as shown in FIG. 1A, a barrier metal layer 5 of Ti, which is of a multilayer structure composed of a lower barrier metal layer 5A of Ti and an upper barrier metal layer 5B of TiN, is deposited on the inter-insulating layer 3 including the connecting hole 4.

Then, an interconnection material layer 6 of blanket tungsten is deposited on the barrier metal layer 5 so as to fill the recess that has been produced therein by the connecting hole 4.

A thermally oxidized device-separating thick insulating layer 7. i.e., LOCOS, is formed on the substrate 1. A channel-stop region 8 of a high impurity concentration is disposed on the semiconductor surface beneath the thick insulating layer 7.

Then, anisotropic dry etching is effected on the interconnection material layer 6 and the barrier metal layer 5 using a fluorine gas for thereby removing a flat portion of the interconnection material layer 6 except its portion within the connecting hole 4, by way of etchback, as shown in FIG. 1B. Thus, an interconnection contact is formed as a metal plug that is filled in the connecting hole 4 and composed primarily of the interconnection material layer 6 of Blk-W.

Upon anisotropic dry etching using a fluorine gas as of $SF_6$ or $CF_4$, for example, the etchback on the interconnection material layer 6 of Blk-W progresses until the lower Ti barrier metal layer 5 is exposed. Thereafter, the etchback on the interconnection material layer 6 of Blk-W ceases. Since only etching of the barrier metal layer 5 subsequently goes on and results in a certain degree of overetching, the interconnection material layer 6 of Blk-W projects beyond the other portions, as shown in FIG. 1C. If an interconnection pattern of Al or the like is formed on the projecting interconnection material layer 6, it may possibly be broken or otherwise damaged thereby.

It has been found out that such a phenomenon is caused for the following reason: At the time the Ti barrier metal layer 5 is exposed, the Ti and the dry etching gas, e.g., $SF_6$ or $CF_4$, reacts with each other, generating a fluoride TiF. As shown in FIG. 1B, the generated fluoride TiF is deposited on the interconnection material layer 6 of Blk-W, forming a film 9 of TiF which has an etching rate that is much lower than the etching rate of the Ti barrier metal layer 5.

The above difficulty experienced by the generation of the fluoride of Ti in the formation of the interconnection contact that is formed as the metal plug in the connecting hole defined in the inter-insulating layer also occurs in a structure as shown in FIGS. 2A and 2B of the accompanying drawings. In FIGS. 2A and 2B, an interconnection material layer 6 as of tungsten, molybdenum, polycrystalline Si, or the like is deposited on a surface 11 of a substrate 13 having a step 12 by anisotropic dry etching using a fluorine gas, with a barrier metal layer 5 disposed as a Ti base layer underneath the interconnection material layer 6. The interconnection material layer 6 is etched to a desired pattern extending across the step 12.

More specifically, as shown in FIG. 2A, the interconnection material layer 6 is deposited on the entire surface of the Ti barrier metal layer 5 which is composed of a lower barrier metal layer 5A of Ti and an upper barrier metal layer 5B of TiN on the entire surface of the surface 11 of the substrate 13 that has the step 12. To etch the interconnection material layer 6 to a predetermined pattern for thereby forming an interconnection of the same pattern, an etching resist 10 having that pattern is formed on the interconnection material layer 6, and then, using the etching resist 10 as a mask, the interconnection material layer 6 is etched by way of anisotropic dry etching using a fluorine gas, as shown in FIG. 2B. If the interconnection material layer 6 is deposited by CVD, for example, then it is deposited also on a vertical wall surface of the step 12, and the interconnection material layer 6 deposited thereon has a larger vertical thickness along the vertical wall surface of the step 12 in the etching direction.

Accordingly, even when the etching of the interconnection material layer 6 deposited on a horizontal surface and having a smaller vertical thickness is finished, exposing the barrier metal layer 5 therebeneath, the interconnection material layer 6 still remains unremoved as a remaining layer 6s (see FIG. 2B) on the vertical wall surface of the step 12. Thus, a film 9 of TiF is formed on the remaining layer 6s, and prevents the remaining layer 6s from being further etched away, so that an undesired interconnection material remains on the vertical wall surface of the step 12.

The remaining layer 6s causes a short circuit between interconnections on the substrate 13. One solution is to effect the etching process for a long period of time to etch away the film 9 which has a very low etching rate and the remaining interconnection material layer 6 disposed therebeneath, so that the unwanted remaining layer 6s will be eliminated from the step 12. If the etching process is prolonged, however, the interconnection material layer 6 on the horizontal surface will be overetched, resulting in unduly narrow interconnections. Therefore, high-density fine interconnection patterns for use in ULSI circuits, for example, cannot be formed highly reliably.

OBJECTS AND SUMMARY OF THE INVENTION

It is an object of the present invention to provide a method of and an apparatus for forming an interconnection reliably in a semiconductor device even if there is a step on a surface on which the interconnection is to be formed.

According to the present invention, there is provided a method of forming an interconnection on a substrate, comprising depositing an interconnection material layer on a surface of a substrate having a step with a base layer of Ti-base metal disposed between the interconnection material layer and the substrate, etching the interconnection material layer by way of dry etching using a fluorine gas until a surface of the base layer is exposed, and after the surface of the base layer is exposed, heating the substrate to a temperature higher than about 250° C. and continuously etching the interconnection material layer and the base layer by way of dry etching.

The interconnection material layer and the base layer may be etched by way of dry etching to a depth where a portion of the base layer remains unremoved.

Alternatively, the interconnection material layer and the base layer may be etched by way of dry etching until the base layer beneath the interconnection material layer which is etched away is removed.

The dry etching may be anisotropic etching.

According to the present invention, there is also provided an apparatus for forming an interconnection on a substrate, comprising a dry etching chamber for etching a substrate disposed therein, the dry etching chamber having a support for supporting the substrate thereon, and heating means disposed near the support for heating the substrate supported on the support.

The heating means may comprise an infrared lamp or a heated gas.

As described above, the interconnection material layer is etched until the base layer, i.e., a barrier metal layer, is exposed, without the substrate being heated. After the base layer is exposed, the substrate is heated to a temperature in the range of from 250° C. to 600° C. Subsequently, the etching process is smoothly carried out without being hampered, and hence the interconnection material layer is etched well.

Any TiF that is generated upon exposure of the base layer of Ti to the fluorine gas used in the dry etching process is sublimed by the heat of the substrate. Therefore, the generated TiF is prevented from being deposited on the surface of the interconnection material layer.

Not heating the substrate until the base layer is exposed is effective to carry out efficient etching. It is therefore preferable to heat the substrate after the base layer is exposed by the etching of the interconnection material layer, specifically, after the base layer beneath the portion of the interconnection material layer which is smaller in thickness on a flat surface other than the step.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

Figure 3A:
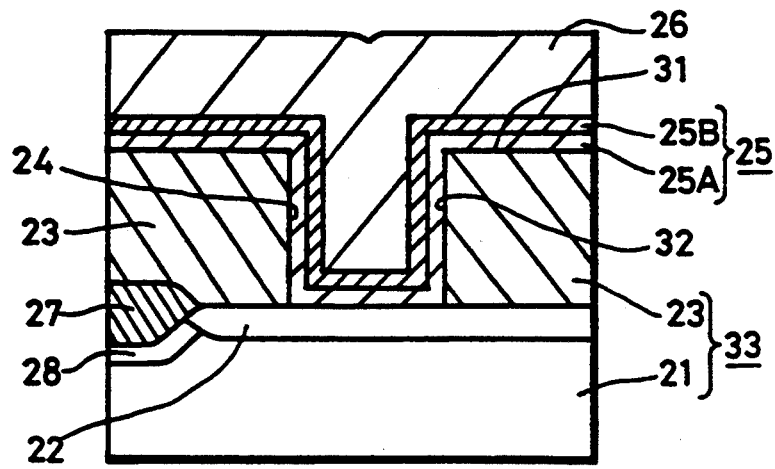
FIGS. 3A through 3C are fragmentary cross-sectional view illustrative of a method of forming an interconnection according to a first embodiment of the present invention.
Figure 3B:
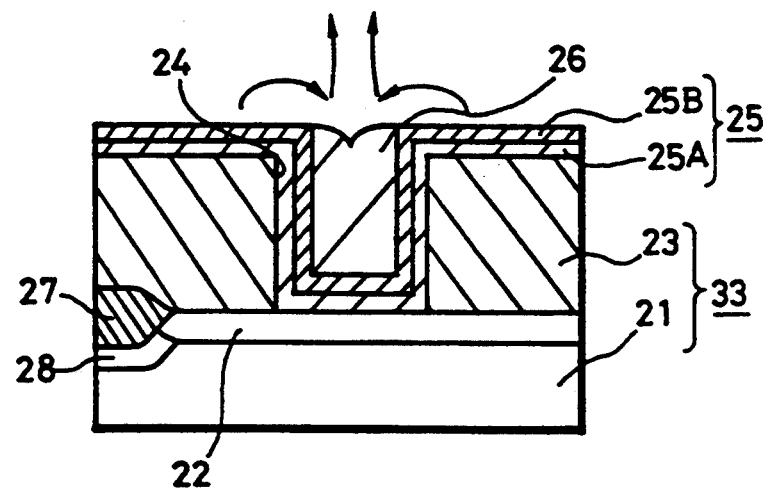
Figure 3C:
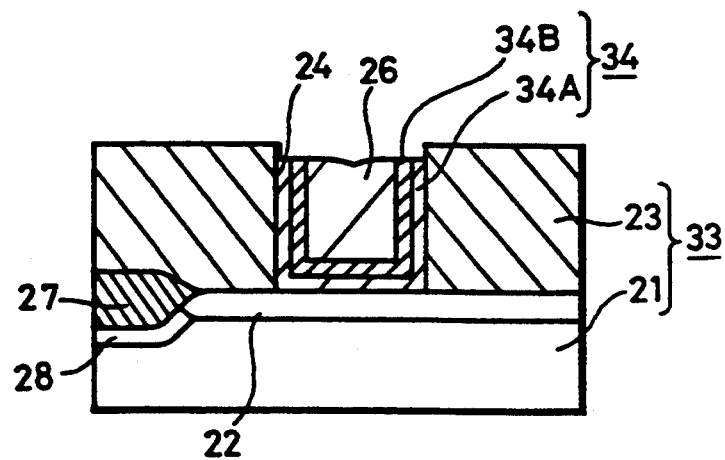

As shown in FIGS. 3A through 3C, a semiconductor substrate 21, e.g., an Si single-crystal semiconductor substrate of a first conductivity type, e.g., a low-concentration p-type, includes a semiconductor region 22 that serves as a source or drain region of a MOS transistor (insulated field-effect transistor) that is formed by selective diffusion or ion implantation of an impurity of a second conductivity type, e.g., an n-type. An interconnection will be connected to the semiconductor region 22 through a connecting hole 24 defined in an inter-insulating layer 23 that is deposited on the semiconductor substrate 21. The semiconductor substrate 21 and the inter-insulating layer 23 jointly serve as a substrate 33 having a surface 31 on which the interconnection will be formed, the surface 31 including a step 32 produced by the connecting hole 24 in the inter-insulating layer 23.

First, as shown in FIG. 3A, a base layer 25 of Ti, i.e., a barrier metal layer, is deposited on the inter-insulating layer 23 including the connecting hole 24. The base layer 25 is of a two-layer structure comprising a lower barrier metal layer 25A of Ti disposed on the inter-insulating layer 23, and an upper barrier metal layer 25B of TiN disposed on the lower barrier metal layer 25A.

Then, an interconnection material layer 26 of Blk-W is deposited, by way of CVD, for example, on the barrier metal layer 25 while filling the recess that is formed in the surface formed so far due to the connecting hole 24.

A thermally oxidized device-separating thick insulating layer 27, i.e., LOCOS, is formed on the Si semiconductor substrate 21. A channel-stop region 28 of a high impurity concentration which is of the first conductivity type is disposed on the semiconductor substrate 21 beneath the thick insulating layer 27.

Then, anisotropic dry etching is effected on the interconnection material layer 26 and the barrier metal layer 25 using a fluorine gas for thereby removing a flat portion of the interconnection material layer 26 except its portion within the connecting hole 24, by way of etchback, as shown in FIG. 3B. Thus, an interconnection contact is formed as a metal plug that is filled in the connecting hole 24 and composed primarily of the interconnection material layer 26 of Blk-W.

Figure 4:
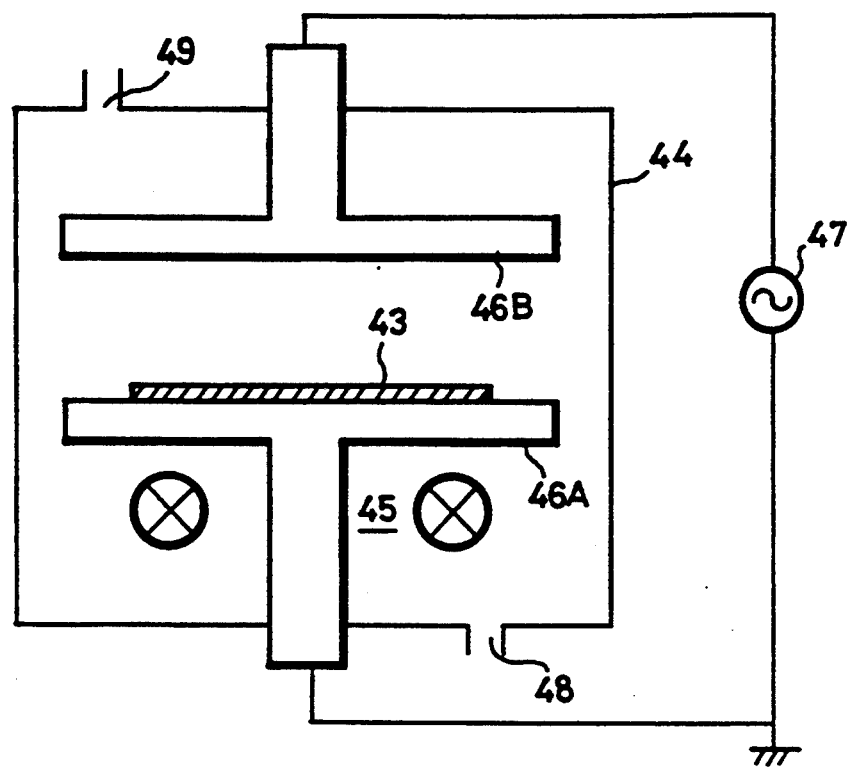
FIG. 4 is a schematic view of an apparatus for forming an interconnection according to a second embodiment of the present invention.

The anisotropic dry etching is carried out by a reactive ion etching (RIE) apparatus according to a second embodiment of the present invention as shown in FIG. 4.

As shown in FIG. 4, the reactive ion etching apparatus has a dry etching chamber 44 which houses a pair of spaced flat parallel electrodes 46A, 46B, the electrode 46A supporting a substrate 43 to be etched.

A high-frequency electric energy is applied between the electrodes 46A, 46B by a high-frequency power supply 47.

The reactive ion etching apparatus also has a heater 45, which may comprise an infrared lamp, disposed below the electrode 46A for heating the substrate 43 on the electrode 46A.

The dry etching chamber 44 is evacuated to a high degree of vacuum through an exhaust port 48 by a vacuum pump (not shown), and is supplied with a fluorine gas as of $SF_6$ or $CF_4$, for example, through a gas supply port 49.

Using the reactive ion etching apparatus shown in FIG. 4, the substrate 43 is etched back by dry etching while the substrate 43 is not being heated, as shown in FIG. 3B. First, the interconnection material layer 26 on a horizontal flat surface of the inter-insulating layer 23, which interconnection material layer 26 has a smaller thickness than that of the interconnection material layer 26 in the connecting hole 24, is etched away, exposing the barrier metal layer 25 on the horizontal flat surface of the inter-insulating layer 23. The exposure of the barrier metal layer 25 may be detected by an ordinary end-point detecting process, e.g., an atomic absorption process. After the exposure of the barrier metal layer 25 has been detected, the substrate 33, i.e., the substrate 43 in FIG. 4, is heated to a temperature ranging from 250° C. to 600° C., preferably from 250° C. to 500° C. by the heater 45, and etched while being heated.

When the substrate 33 is thus etched while being heated, the Ti of the base layer 25 reacts with the fluorine of the etching gas, generating a fluoride TiF. However, since the generated fluoride TiF is sublimed because of the heat of the substrate 33 (43), any film having a low etching rate such as the film 9 as shown in FIGS. 1A~1C and 2A, 2B is prevented from being formed.

Subsequently, the interconnection material layer 26 and the base layer 25 are etched at the same time until a metal plug of the interconnection material layer 26 is produced which has an upper surface lying flush with the upper surface of the remaining base layer 25 in the connecting hole 24, as shown in FIG. 3C.

After the metal plug has been formed, an interconnection of Al (not shown), for example, is formed on the metal plug.

While an interconnection will be connected to the semiconductor region 22 through the connecting hole 24 defined in the inter-insulating layer 23 in the embodiment shown in FIGS. 3A through 3C, the principles of the present invention are also applicable to the formation of an upper interconnection layer on a lower interconnection layer in a multilayer interconnection structure.

In the above embodiment, the interconnection contact is made through the connecting hole 24 defined in the inter-insulating layer 23. However, the principles of the present invention are also applicable to the formation of an interconnection pattern extending across a step on a surface as shown in FIGS. 2A and 2B.

To form such an interconnection pattern, the substrate 33 is heated and continuously etched after the portion of the base layer 25 on the flat horizontal surface 31, which portion has a smaller vertical thickness than that of the base layer 25 in the connecting hole 24, is exposed upon etching of the interconnection material layer 26.

Figure 2A:
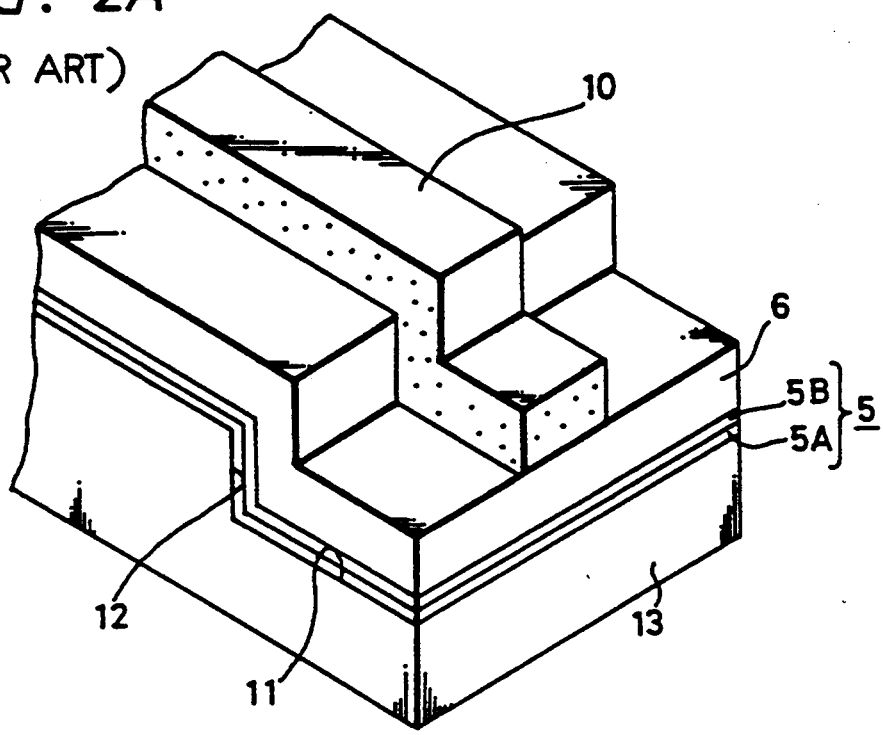
FIGS. 2A and 2B are fragmentary cross-sectional view illustrative of another method of forming an interconnection according to the related art.
Figure 2B:
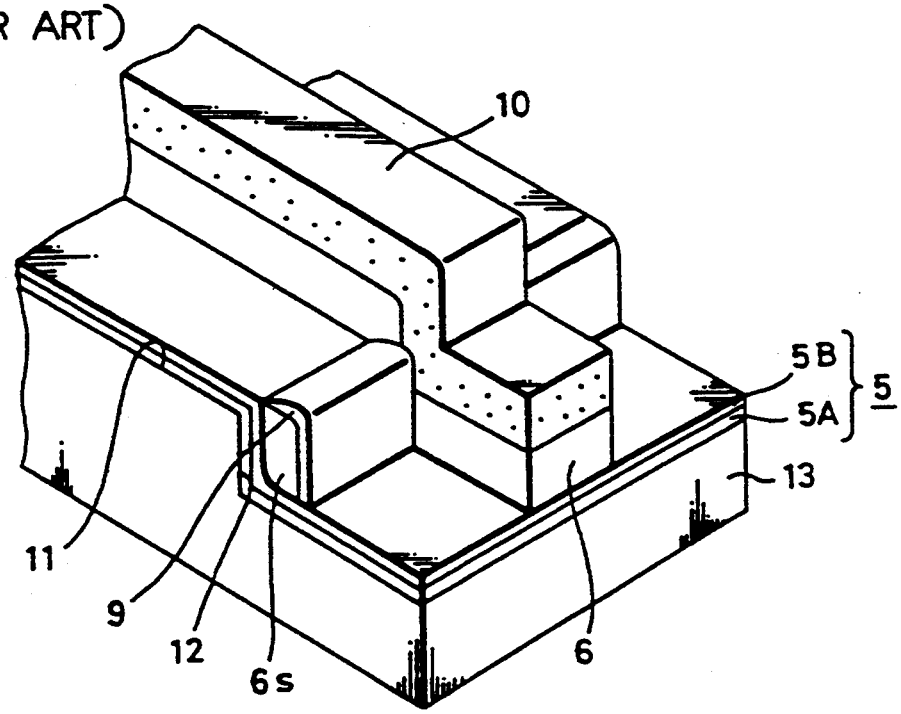

Inasmuch as TiF produced by reaction between the Ti of the base layer 25 and the fluorine of the etching gas is sublimed by the heat of the substrate 33, no film of TiF which has a low etching rate is formed on the portion of the interconnection material layer 26 on the vertical wall surface of the step such as the step 12 shown in FIGS. 2A and 2B.

The interconnection material layer remaining on the vertical wall surface of the step can be etched away relatively quickly. Therefore, interconnection patterns are prevented from being short-circuited by the interconnection material layer which would otherwise remain unremoved, and also from being too narrowed by a prolonged etching process.

In the above embodiment, the interconnection material layer 26 is formed of blanket tungsten by CVD. However, the interconnection material layer 26 may be formed of tungsten by another deposition process, or polycrystalline silicon or molybdenum which will be etched by way of dry etching using a fluorine gas.

The dry etching process may not necessarily be limited to an anisotropic etching process, but may be an isotropic etching process using a fluorine gas.

The base layer 25 of Ti beneath the interconnection material layer 26 is etched in the above embodiment. The principles of the present invention are also applicable to an instance in which even when the base layer 25 is not etched at all or is not substantially etched, the interconnection material layer 26 is prevented from being etched by the exposed surface of Ti.

Figure 5:
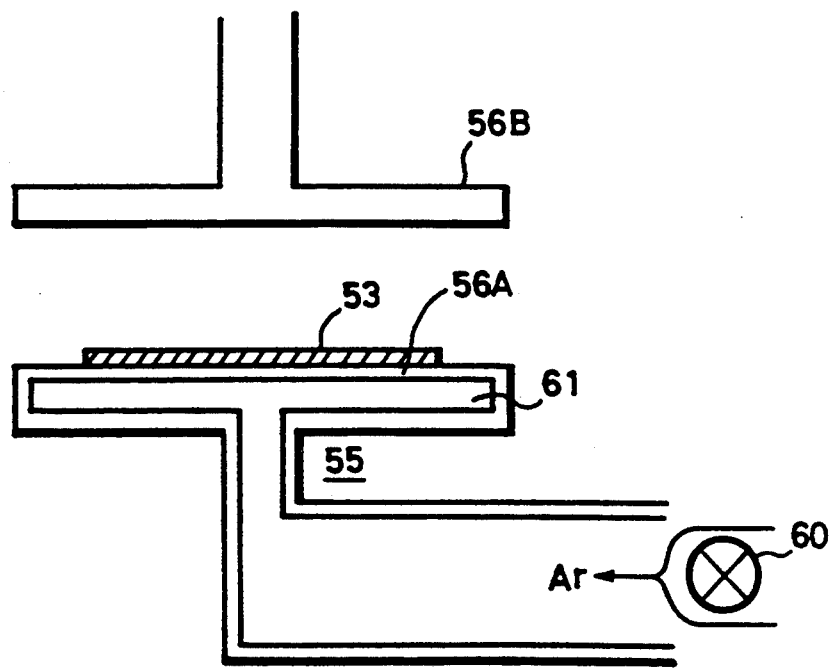
FIG. 5 is a schematic view of an apparatus for forming an interconnection according to a third embodiment of the present invention.

FIG. 5 shows an apparatus for forming an interconnection according to a third embodiment of the present invention. In FIG. 5, the apparatus comprises a reactive ion etching apparatus having a pair of spaced flat parallel electrodes 56A, 56B with a substrate 53 supported on the electrode 56A. The apparatus also has a heater 55 which may be of a hollow structure 61 of the electrode 56A itself or a hollow housing 61 thermally intimately coupled to the electrode 56A. The hollow structure or housing 61 is supplied with an inert gas such as an Ar gas heated by a heater 60 such as a halogen lamp, for example.

The apparatus according to the present invention may also comprise a magnetron etching apparatus or an electron cyclotron resonance (ECR) etching apparatus, for example, rather than the reactive ion etching apparatus.

As described above, the substrate 43 (53) is heated to a temperature ranging from 250° C. to 600° C. preferably from 250° C. to 500° C. If the substrate 43 (53) were heated to a temperature below 250°, the fluoride TiF would not easily be sublimed. If the substrate 43 (53) were heated to a temperature beyond 500° C., particularly 600° C., the etched surface would be roughened.

According to the present invention, as described above, the interconnection material layer is etched until the base layer of Ti, i.e., the barrier metal layer, is exposed, without the substrate being heated. After the base layer is exposed, the substrate is heated to a temperature in the range of from 250° C. to 600° C. The heat of the substrate is then effective to sublime any TiF that is generated upon exposure of the base layer of Ti to the fluorine gas used in the dry etching process. Therefore, the generated TiF is prevented from being deposited on the surface of the interconnection material layer, and hence from preventing the interconnection material layer from being further etched.

Figure 1A:
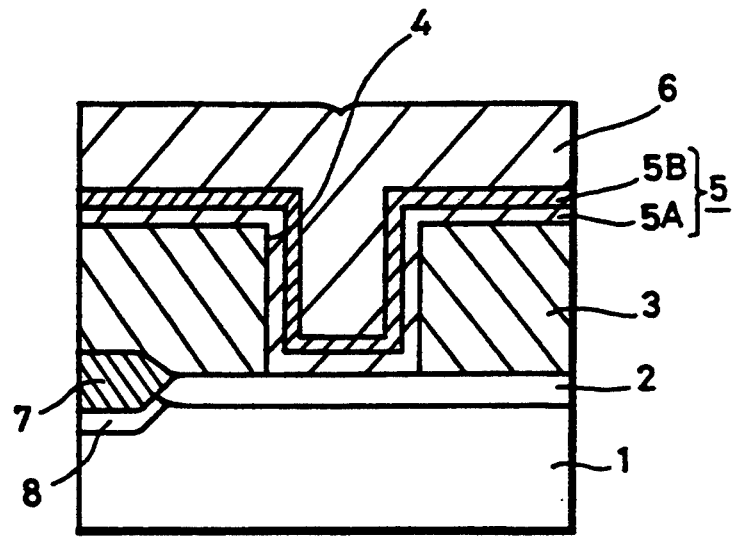
FIGS. 1A through 1C are fragmentary cross-sectional view illustrative of a method or, forming an interconnection according to the related art.
Figure 1B:
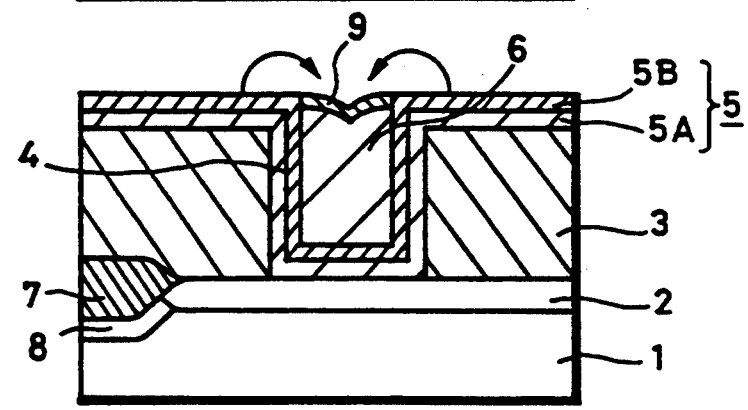
Figure 1C:
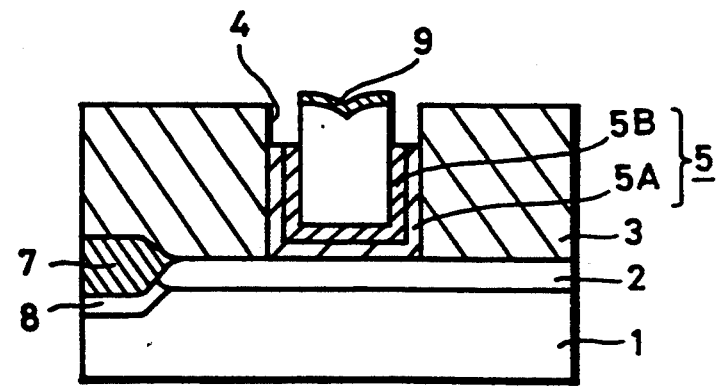

Consequently, in the formation of the metal plug as the portion of the interconnection material layer filling the connecting hole defined in the inter-insulating layer, the interconnection material layer is prevented from projecting beyond the other portions, as shown in FIG. 1C, and hence from breaking an interconnection pattern formed thereon. Therefore, any subsequently formed interconnection pattern has highly reliable.

In addition, in the formation of an interconnection pattern by way of selective etching of the interconnection material layer as shown in FIGS. 2A and 2B, since any interconnection material layer that remains on the vertical wall surface of the step can be etched away quickly and hence no interconnection material layer remains unremoved thereon, interconnection patterns are prevented from being unduly narrowed by a prolonged etching process which would otherwise be required to remove the remaining interconnection material layer from the vertical wall surface of the step, and thus are highly reliable. Therefore, the method according to the present invention is effective to eliminate various drawbacks which have prevented interconnection patterns from being formed with a high packing density and in a fine pattern arrangement, and hence offers various important practical advantages.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A method of forming an interconnection on a substrate, comprising:
depositing an interconnection material layer over a surface of a substrate having a step with a base layer of metal containing Ti disposed between the interconnection material layer and the substrate;
etching the interconnection material layer by way of dry etching using fluorine containing gas until a surface of said base layer is exposed; and
after the surface of said base layer is exposed, heating the substrate to a temperature higher than about 250° C., and continuously etching the interconnection material layer and the base layer by way of dry etching using the fluorine containing gas.

2. A method according to claim 1, wherein said interconnection material layer and said base layer are etched by way of dry etching to a depth where a portion of said base layer remains unremoved.

3. A method according to claim 1, wherein said interconnection material layer and said base layer are etched by way of dry etching until the base layer beneath the interconnection material layer which is etched away is removed.

4. A method according to claim 1, wherein said dry etching is anisotropic etching.

* * * * *